US008525227B2

(12) United States Patent
Jeon et al.

(10) Patent No.: US 8,525,227 B2
(45) Date of Patent: Sep. 3, 2013

(54) SEMICONDUCTOR DEVICE AND METHOD OF MANUFACTURING THE SAME

(75) Inventors: Woo Chul Jeon, Suwon (KR); Ki Yeol Park, Suwon (KR); Young Hwan Park, Seoul (KR); Jung Hee Lee, Daegu (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 278 days.

(21) Appl. No.: 12/964,218

(22) Filed: Dec. 9, 2010

(65) Prior Publication Data

US 2011/0233520 A1    Sep. 29, 2011

(30) Foreign Application Priority Data

Mar. 26, 2010    (KR) .................. 10-2010-0027391

(51) Int. Cl.
 *H01L 29/66*    (2006.01)
(52) U.S. Cl.
 USPC ............ 257/192; 257/E21.403; 257/E29.248; 438/412
(58) Field of Classification Search
 USPC .................. 257/192, 194, 622, 623, E21.403, 257/E21.47, E21.409, E21.41, E29.248; 438/412
 See application file for complete search history.

(56) References Cited

U.S. PATENT DOCUMENTS

| 4,780,748 | A | 10/1988 | Cunningham et al. |
| 7,038,253 | B2 | 5/2006 | Yoshida et al. |
| 7,479,651 | B2 | 1/2009 | Murata et al. |
| 2008/0217625 | A1 | 9/2008 | Kuroda et al. |
| 2008/0237605 | A1 | 10/2008 | Murata et al. |

FOREIGN PATENT DOCUMENTS

| JP | 2007-227014 A | 9/2007 |
| JP | 2008-270794 | 11/2008 |

*Primary Examiner* — Julio J Maldonado
*Assistant Examiner* — Sonya D McCall Shepard
(74) *Attorney, Agent, or Firm* — McDermott Will & Emery LLP

(57) ABSTRACT

There is provided a semiconductor device including a base substrate; a semiconductor layer formed on the base substrate and having a mesa protrusion including a receiving groove; a source electrode and a drain electrode disposed to be spaced apart from each other on the semiconductor layer, the source electrode having a source leg and the drain electrode having a drain leg; and a gate electrode insulated from the source electrode and the drain electrode and having a recess part received into the receiving groove. The mesa protrusion has a superlattice structure including at least one trench at an interface between the mesa protrusion and the source electrode and between the mesa protrusion and the drain electrode, respectively, and the source leg and the drain leg are received in the trench.

20 Claims, 2 Drawing Sheets

SEMICONDUCTOR DEVICE AND METHOD OF MANUFACTURING THE SAME

CROSS-REFERENCE TO RELATED APPLICATIONS

This application claims the priority of Korean Patent Application No. 10-2010-0027391 filed on Mar. 26, 2010, in the Korean Intellectual Property Office, the disclosure of which is incorporated herein by reference.

BACKGROUND OF THE INVENTION

1. Field of the Invention

The present invention relates to a semiconductor device, and more particularly, to a semiconductor device having a nitride-based semiconductor field effect transistor structure and a method of manufacturing the same.

2. Description of the Related Art

In general, a group III-nitride-based semiconductor including group III elements such as gallium (Ga), aluminum (Al), indium (In), or the like, and nitrogen (N), has characteristics such as a wide energy band gap, high electron mobility, high saturation electron speed, high thermochemical stability, and the like. A nitride-based field effect transistor (N-FET) based on the group III-nitride-based semiconductor is manufactured using a semiconductor material having a wide energy band gap, for example, gallium nitride (GaN), aluminum gallium nitride (AlGaN), indium gallium nitride (InGaN), aluminum indium gallium nitride (AlINGaN), or the like.

A general N-FET has a High Electron Mobility Transistor (HEMT) structure. For example, a semiconductor device having the HMET structure includes a base substrate, a nitride-based semiconductor layer formed on the base substrate, and a source electrode and a drain electrode formed on the semiconductor layer, and a gate electrode formed on the semiconductor layer between the source electrode and the drain electrode.

According to such a semiconductor device, 2-Dimensional Electron Gas (2DEG), used as a current flow path, may be generated inside the semiconductor layer. However, the N-FET having the above-described structure may have an error in transistor operations due to an electric field concentrated on the gate electrode and the drain electrode.

Particularly, the semiconductor device having the HMET structure requires high-voltage operation, so the high electric field concentrated on the gate electrode and the drain electrode deteriorates the performance of the device.

SUMMARY OF THE INVENTION

An aspect of the present invention provides a semiconductor device having a High Electron Mobility Transistor (HEMT) structure allowing for enhanced performance and a method of manufacturing the same.

According to an aspect of the present invention, there is provided a semiconductor device including: a base substrate; a semiconductor layer formed on the base substrate and having a mesa protrusion including a receiving groove; a source electrode and a drain electrode disposed to be spaced apart from each other on the semiconductor layer, the source electrode having a source leg and the drain electrode having a drain leg; and a gate electrode insulated from the source electrode and the drain electrode and having a recess part received into the receiving groove, wherein the mesa protrusion has a superlattice structure including at least one trench at an interface between the mesa protrusion and the source electrode and between the mesa protrusion and the drain electrode, respectively, and the source leg and the drain leg are received in the trench.

A lowest layer of the superlattice structure may be disposed so as to be on the same level as or be above a bottom surface of the trench.

The superlattice structure may include a high-concentration doping layer.

The superlattice structure may include a multi-layered 2-dimensional electron gas layer aligned in a thickness direction.

The superlattice structure may include a multi-layered delta doping layer aligned in a thickness direction.

The delta doping layer may be formed by being doped with at least any one selected from Si, Ge, and Sn.

The semiconductor device may further include an oxide layer interposed between the semiconductor layer and the gate electrode.

The oxide layer may have a recess structure corresponding to a shape of the recess part.

A lowest layer of the superlattice structure may be disposed so as to be on the same level as or be above a bottom surface of the oxide layer.

The semiconductor device may further include a buffer layer between the base substrate and the semiconductor layer.

According to another aspect of the present invention, there is provided a method of manufacturing a semiconductor device, the method including: preparing a base substrate; forming a semiconductor layer having a mesa protrusion including a receiving groove on the base substrate; forming a source electrode having a source leg and a drain electrode having a drain leg so as to be spaced apart from each other on the semiconductor layer; and forming a gate electrode on the semiconductor layer, the gate electrode being insulated from the source electrode and the drain electrode and having a recess part received into the receiving groove, wherein the mesa protrusion has a superlattice structure including at least one trench at an interface between the mesa protrusion and the source electrode and between the mesa protrusion and the drain electrode, respectively, and the source leg and the drain leg are received in the trench.

A lowest layer of the superlattice structure may be disposed so as to be on the same level as or be above a bottom surface of the trench.

The superlattice structure may include a high-concentration doping layer.

The superlattice structure may include a multi-layered 2-dimensional electron gas layer aligned in a thickness direction.

The superlattice structure may include a multi-layered delta doping layer aligned in a thickness direction.

The delta doping layer may be formed by being doped with at least any one selected from Si, Ge, and Sn.

The method may further include forming an oxide layer to be recessed into the receiving groove prior to the forming of the gate electrode.

The oxide layer may have a recess structure corresponding to a shape of the recess part.

A lowest layer of the superlattice structure may be disposed so as to be on the same level as or be above a bottom surface of the oxide layer.

The method may further include forming a buffer layer on the base substrate prior to the forming of the semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
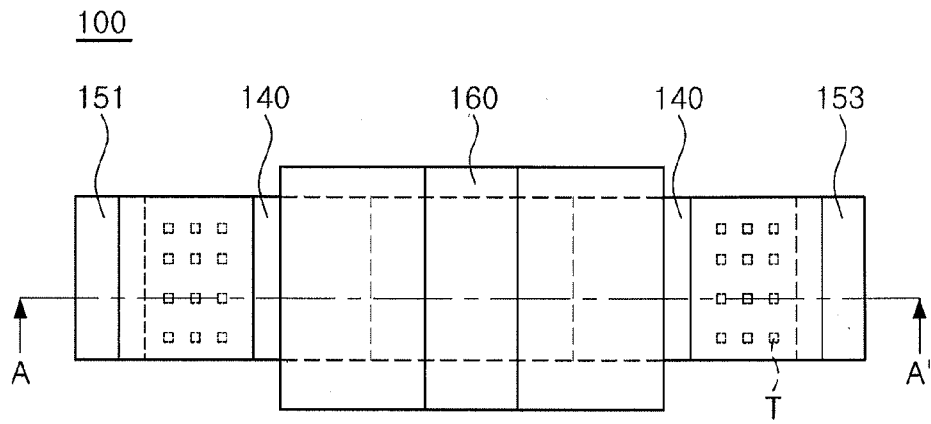
FIG. 1 is a schematic plan view illustrating a semiconductor device according to an exemplary embodiment of the present invention.

Various advantages and features of the present invention and a method thereof will become apparent from the following description of exemplary embodiments with reference to the accompanying drawings. However, the present invention may be modified in many different manners and should not be construed as being limited to the exemplary embodiments set forth herein. Rather, these exemplary embodiments may be provided so that this disclosure will be thorough and complete, and will fully convey the scope of the invention to those having skill in the art. Throughout the drawings, the same reference numerals will be used to designate the same or like elements.

Terms used in the present specification are used so as to explain the exemplary embodiments rather than limiting the present invention thereto. Unless explicitly described to the contrary, a singular form includes a plural form in the present specification. The word "include" and variations such as "includes" or "including," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In the drawings, the thickness of layers and regions may be exaggerated for efficient description of technical contents and consequently, exemplified forms may be changed by manufacturing technologies and/or tolerances. Therefore, the exemplary embodiments of the present invention are not limited to specific forms but may include a change in forms generated according to the manufacturing processes. For example, an etching region shown vertically may be rounded or may have a predetermined curvature. Therefore, the regions shown in the drawings have schematic attributes and the shapes shown in the drawings show specific shapes of device regions by way of example only, but are not limited to the scope of the invention.

Hereinafter, a semiconductor device and a method of manufacturing the same according to exemplary embodiments of the present invention will be described with reference to the accompanying drawings.

Figure 2:
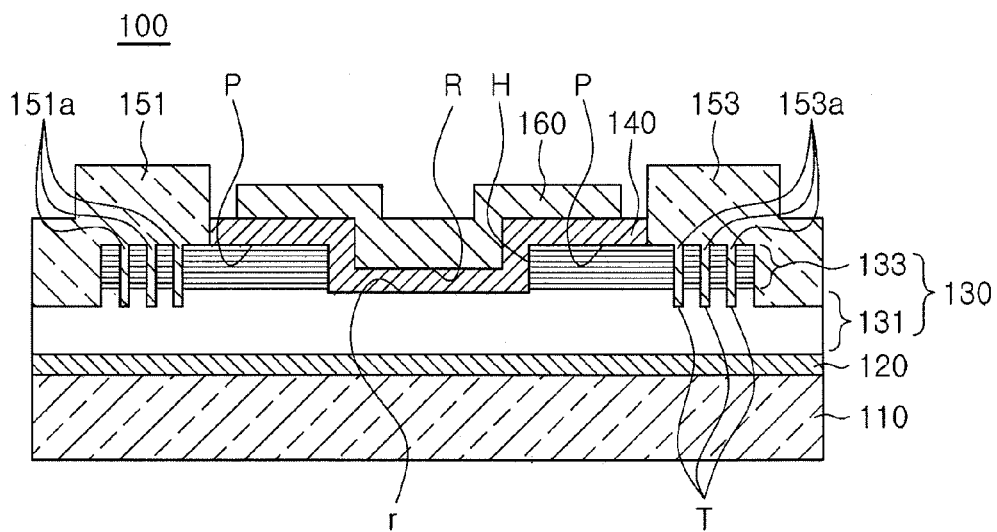
FIG. 2 is a cross-sectional view taken along line A-A' of FIG. 1.

FIG. 1 is a schematic plan view illustrating a semiconductor device according to an exemplary embodiment of the present invention. FIG. 2 is a cross-sectional view taken along line A-A' of FIG. 1.

Referring to FIGS. 1 and 2, a semiconductor device 100 according to an exemplary embodiment of the invention may include a base substrate 110, a buffer layer 120, a semiconductor layer 130, a source electrode 151, a drain electrode 153, and a gate electrode 160.

The base substrate 110 may be a plate for forming a semiconductor device having a High Electron Mobility Transistor (HEMT) structure. For example, the base substrate 100 may be a semiconductor substrate. As an example, the base substrate 110 may be at least any one of a silicon substrate, a silicon carbide substrate, and a sapphire substrate.

Next, the buffer layer 120 may be disposed on the base substrate 110. As an example, the buffer layer 120 may be formed of an aluminum nitride (AlN) layer; however, the buffer layer 120 is not limited thereto. Herein, the buffer layer 120 may be provided to solve the problems caused due to a lattice mismatch between the base substrate 110 and a lower layer 131 of the semiconductor layer 130 to be subsequently formed.

The semiconductor layer 130 may be disposed on the buffer layer 120. The semiconductor layer 130 includes a mesa protrusion P having a receiving groove H. The mesa protrusion P has a superlattice structure 133 including at least one trench T at the interface between the mesa protrusion P and the source electrode 151 and between the mesa protrusion P and the drain electrode 153, respectively. Further, a lower layer 131 is provided between the mesa protrusion P and the buffer layer 120.

Here, the lowest layer of the superlattice structure 133 may be disposed on the same level as, or be above the bottom surface of the trench T.

Meanwhile, the superlattice structure 133 may be formed of a high-concentration doping layer. The superlattice structure 133 may include a multi-layered 2-Dimensional Electron Gas (2DEG) layer aligned in a thickness direction. Also, the superlattice structure 133 may include a multi-layered delta doping layer aligned in a thickness direction. Herein, the delta doping layer may be formed by being doped with at least any one selected from Si, Ge, and Sn. Preferably, the delta doping layer is doped with Si. However, doping elements of the delta doping layer are not limited thereto.

For example, the lower layer 131 and the mesa protrusion P may be a layer including group III-nitride-based materials. More specifically, the lower layer 131 and the mesa protrusion P may be formed of any one selected from gallium nitride (GaN), aluminum gallium nitride (AlGaN), indium gallium nitride (InGaN), and indium aluminum gallium nitride (InAlGaN).

Meanwhile, the receiving groove H included in the semiconductor layer 130 may be formed through a predetermined photoresist process.

An oxide layer 140 may be provided on the receiving groove H. The oxide layer 140 is further formed through the predetermined photoresist process and has a recess structure r corresponding to the shape of the receiving groove H. The oxide layer 140 may be a layer made of silicon dioxide ($SiO_2$). This exemplary embodiment describes, by way of example, the case in which the oxide layer 140 is an oxide layer, but the oxide layer 140 may include a nitride layer.

The bottom surface of the oxide layer 140 may be disposed to be on the same level as or be below the lowest layer of the superlattice structure 133.

The gate electrode 160 is provided on the oxide layer 140. The gate electrode 160 includes a recess part R received in the recess structure r of the oxide layer 140. Herein, the lowest portion of the recess part R may be disposed to traverse the superlattice layer 133.

The gate electrode 160, disposed on the oxide layer 140, may directly contact the oxide layer 140, thereby forming a Schottky electrode.

The source electrode 151 and the drain electrode 153 may be disposed to be spaced apart from each other, having the gate electrode 160 therebetween. The source electrode 151 and the drain electrode 153 junction the mesa protrusion P of the semiconductor layer 130, such that they may form an ohmic contact. More specifically, they contact in such a manner that a source leg 151*a* of the source electrode 151 and a drain leg 153*a* of the drain electrode 153 are received in the trench T of the superlattice structure 133. Also, since the mesa protrusion P including the trench T has the superlattice structure 133, this leads to improved contact due to an increase in contact area, simplified processes due to a reduction in a heat treatment temperature, and reduced ohmic contact resistance due to an increase in current amount per unit area.

Meanwhile, the source electrode 151, the drain electrode 153, and the gate electrode 160 may be formed of various materials. As an example, the source electrode 151 and the drain electrode 153 may be formed of the same metal material and the gate electrode 160 may be formed of a metal material different from the source electrode 151. In this case, the source electrode 151 and the drain electrode 153 are formed of titanium (Ti), aluminum (Al), nickel (Ni), and gold (Au) from the lower portions thereof, wherein the titanium (Ti) and the aluminum (Al) of the lower portions may junction any one selected from gallium nitride (GaN), aluminum gallium nitride (AlGaN), indium gallium nitride (InGaN), and indium aluminum gallium nitride (InAlGaN) that form the lower layer 131, the mesa protrusion P, and the trench T, thereby making it possible to form the ohmic contact. The gate electrode 160 may be formed of a metal material including metal elements different from at least any one of the above-mentioned metal elements. As another example, all of the source electrode 151, drain electrode 153, and gate electrode 160 may be formed of the same metal material. To this end, the source electrode 151, the drain electrode 153, and the gate electrode 160 may simultaneously be formed by forming the same metal layer on the semiconductor layer 130 and then being subjected to the same photoresist etching process.

Referring to FIG. 2, the semiconductor device 100 provides the oxide layer 140 between the gate electrode 160 and the semiconductor layer 130 to form a normally-off state in which current does not flow through the superlattice structure 133 even though voltage is applied to the source electrode 151 and the drain electrode 153, when voltage is not applied to the gate electrode 160. Therefore, the semiconductor device 100 may have an HEMT structure capable of performing an enhancement mode operation, which prevents current from flowing when the gate voltage is 0 or negative (−).

According to the embodiment of the invention, the source electrode 151 and the drain electrode 153 junction the mesa protrusion P of the semiconductor layer 130 in such a manner that the source leg 151*a* and the drain leg 153*a* are received in the trench T of the superlattice structure 133, and the mesa protrusion P including the trench T has the superlattice structure 133. This leads to improved contact due to an increase in contact area, simplified processes due to a reduction in a heat treatment temperature, and reduced ohmic contact resistance due to an increase in current amount per unit area.

A method of manufacturing a semiconductor device according to an exemplary embodiment of the present invention will hereinafter be described in detail. Repeated descriptions of the semiconductor device according to the aforementioned embodiment of the invention will be omitted and simplified.

FIGS. 3 through 6 are schematic cross-sectional views illustrating a method of manufacturing a semiconductor device according to an exemplary embodiment of the present invention.

Figure 3:
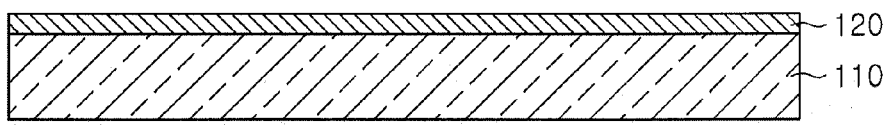
FIGS. 3 through 6 are schematic cross-sectional views illustrating a method of manufacturing a semiconductor device according to an exemplary embodiment of the present invention.

As shown in FIG. 3, the base substrate 110 is prepared. As the base substrate 110, a semiconductor substrate may be used. For example, the semiconductor substrate may be at least any one of a silicon substrate, a silicon carbide substrate, and a sapphire substrate. However, the base substrate 110 is not limited thereto.

Then, the buffer layer 120 and the semiconductor layer 130 may be sequentially formed on the base substrate 110.

In the forming of the semiconductor layer 130, the lower layer 131 may be epitaxially grown by using the buffer layer 120 as a seed layer, and the superlattice layer 133 may be then grown by using the lower layer 131 as a seed layer.

The superlattice layer 133 has a structure in which an ultra-thin layer is constituted of atoms aligned in a lattice form inside a crystal, which is periodically aligned exceeding the periodic orbit of atoms. The superlattice layer 133 may be formed by alternately aligning two- or three-types ultra-thin layers.

Herein, the superlattice layer 133 may be formed by alternately aligning a multi-layered aluminum gallium nitride (AlGaN) layer and a multi-layered gallium nitride (GaN) layer in a thickness direction. In this case, 2DEG may be formed at the interface between the aluminum gallium nitride (AlGaN) layer and the gallium nitride (GaN) layer.

As an epitaxial growth process for forming the aluminum gallium nitride (AlGaN) layer and the gallium nitride (GaN) layer, at least any one of a molecular beam epitaxial growth process, an atomic layer epitaxial growth process, a flow modulation organometallic vapor phase epitaxial growth process, an organometallic vapor phase epitaxial growth process, and a hybrid vapor phase epitaxial growth process may be used. In another example, as a process for forming the aluminum gallium nitride (AlGaN) layer and the gallium nitride (GaN) layer, any one of a chemical vapor deposition process and a physical vapor deposition process may be used.

The superlattice layer 133 may be formed by alternately aligning a multi-layered gallium nitride layer (GaN) and a delta doping layer in a thickness direction. Herein, the delta doping layer may be formed by being doped with at least any one selected from Si, Ge, and Sn. Preferably, the delta doping layer is doped with Si. However, doping elements of the delta doping layer are not limited thereto.

In the delta doping layer doped with Si as an example, the base substrate 110, formed to the lower layer 131 on which the delta doping layer will be formed, is first disposed inside a reaction tube with a low-pressure hydrogen atmosphere maintained therein and a gallium nitride (GaN) layer is grown and then, the growth of the gallium nitride (GaN) layer is stopped for a predetermined period of time. Thereafter, silane (SiH$_4$) gas is introduced into the reaction tube for a predetermined period of time together with hydrogen gas and ammonium gas to form a Si delta doping layer on the gallium nitride (GaN) layer. The delta doping layer may have a desired number of layers formed by repeating the above-mentioned process.

Figure 4:
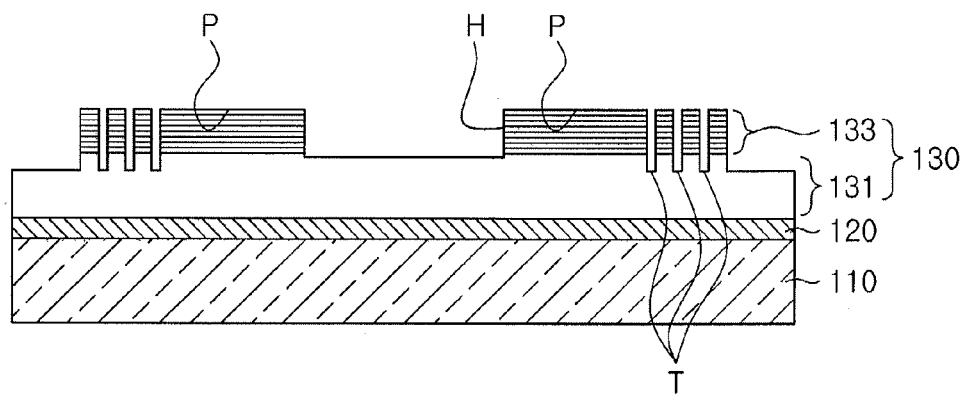

As shown in FIG. 4, a photoresist pattern (not shown) is formed on the semiconductor layer 130 of the previous process. Thereafter, the formation of the semiconductor layer 130 is completed by being mesa-etched using the photoresist pattern as an etch mask and forming at least one trench T on the superlattice layer 133.

Here, the trench T is formed at the interface in contact with the source electrode 141 and the drain electrode 143 to be formed later. Also, the lowest layer of the superlattice layer 133 may be disposed to be on the same level as or be above the bottom surface of the trench T.

Figure 5:
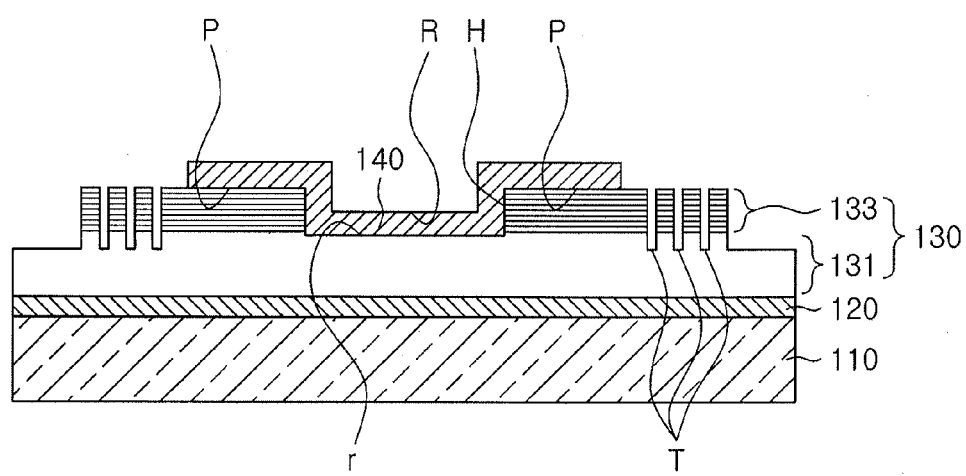

Then, as shown in FIG. 5, the oxide layer 140 may be formed on the semiconductor layer 130. As an example, the oxide layer 140 may be a silicon oxide layer SiO$_2$. After a photoresist pattern (not shown) is formed on the oxide layer 140, the oxide layer 140 may be etched by using the photoresist pattern as an etch mask.

Herein, the oxide layer 140 is recessed into the semiconductor layer 130. The oxide layer 140 is formed to correspond to the shape of the gate electrode 160 to be formed later.

Figure 6:
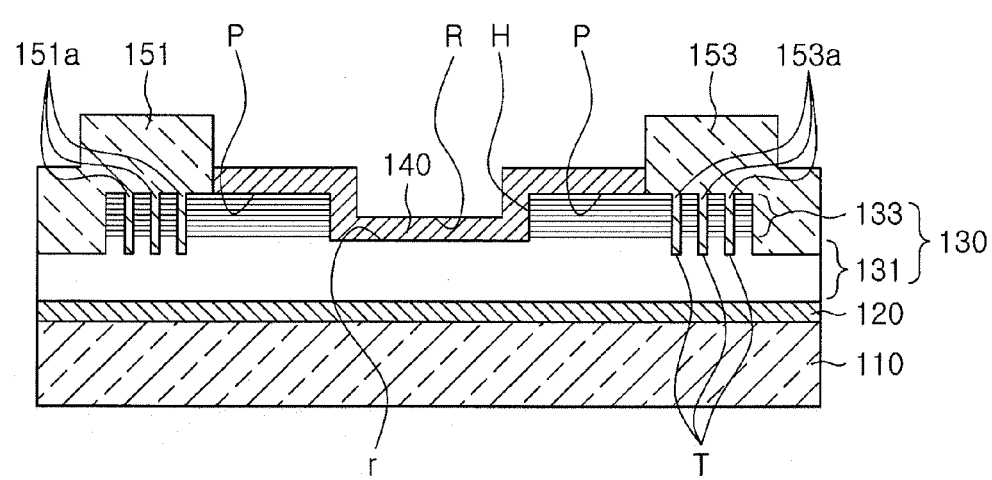

Then, as shown in FIG. 6, the source electrode 151 and the drain electrode 153 may be formed. After a first metal layer is formed on the semiconductor layer 130, the source electrode 151 and the drain electrode 153 disposed to be spaced apart from each other may be formed through a predetermined photoresist etching process. As the first metal layer, a metal layer made of at least any one of gold (Au), nickel (Ni), platinum (Pt), titanium (Ti), aluminum (Al), Palladium (Pd), Iridium (Ir), Rhodium (Rh), Cobalt (Co), Tungsten (W), Molybdenum (Mo), Tantalum (Ta), Copper (Cu), and Zinc (Zn) may be used. Here, the source electrode 151 and the drain electrode 153 are formed at the interface in contact with the trench T.

Thereafter, the gate electrode 160 may be formed on the oxide layer 140. After a second metal layer made of a material different from the first metal layer is formed on the oxide layer 140, the gate electrode 460 is formed by performing a predetermined photoresist etching process. Consequently, the semiconductor device 100 of FIG. 2 may be formed.

According to the embodiment of the invention, the source electrode 151 and the drain electrode 153 junction the mesa protrusion P of the semiconductor layer 130 in such a manner that the source leg 151a and the drain leg 153a are received in the trench T of the superlattice structure 133, and the mesa protrusion P including the trench T has the superlattice structure 133. This leads to improved contact due to an increase in contact area, simplified processes due to a reduction in a heat treatment temperature, and reduced ohmic contact resistance due to an increase in current amount per unit area.

As set forth above, according to exemplary embodiments of the invention, there is provided a semiconductor device having an HEMI structure allowing for enhanced performance and a method of manufacturing the same.

Also, a semiconductor device according to exemplary embodiments of the invention has advantages of improved contact due to an increase in contact area, simplified processes due to a reduction in a heat treatment temperature, and reduced ohmic contact resistance due to an increase in current amount per unit area.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions and also be modified in various forms required in specific application fields and usages of the invention. Therefore, it is to be understood that the invention is not limited to the disclosed exemplary embodiments. It is to be understood that other exemplary embodiments are also included within scope of the appended claims.

What is claimed is:

1. A semiconductor device, comprising:
   a base substrate;
   a semiconductor layer formed on the base substrate and having a mesa protrusion including a receiving groove;
   a source electrode and a drain electrode disposed to be spaced apart from each other on the semiconductor layer, the source electrode having a source leg and the drain electrode having a drain leg; and
   a gate electrode insulated from the source electrode and the drain electrode and having a recess part received into the receiving groove,
   wherein the mesa protrusion has a superlattice structure including a plurality of trenches at an interface between the mesa protrusion and the source electrode and between the mesa protrusion and the drain electrode, respectively, and
   the source leg and the drain leg are received in the trench.

2. The semiconductor device of claim 1, wherein a lowest layer of the superlattice structure is disposed so as to be on the same level as or be above a bottom surface of the trenches.

3. The semiconductor device of claim 1, wherein the superlattice structure includes a high-concentration doping layer.

4. The semiconductor device of claim 3, wherein the superlattice structure includes a multi-layered 2-dimensional electron gas layer aligned in a thickness direction.

5. The semiconductor device of claim 3, wherein the superlattice structure includes a multi-layered delta doping layer aligned in a thickness direction.

6. The semiconductor device of claim 5, wherein the delta doping layer is formed by being doped with at least any one selected from Si, Ge, and Sn.

7. The semiconductor device of claim 1, further comprising an oxide layer interposed between the semiconductor layer and the gate electrode.

8. The semiconductor device of claim 7, wherein the oxide layer has a recess structure corresponding to a shape of the recess part.

9. The semiconductor device of claim 6, wherein a lowest layer of the superlattice structure is disposed so as to be on the same level as or be above a bottom surface of the oxide layer.

10. The semiconductor device of claim 1, further comprising a buffer layer between the base substrate and the semiconductor layer.

11. A method of manufacturing a semiconductor device, the method comprising:
    preparing a base substrate;
    forming a semiconductor layer having a mesa protrusion including a receiving groove on the base substrate;
    forming a source electrode having a source leg and a drain electrode having a drain leg so as to be spaced apart from each other on the semiconductor layer; and
    forming a gate electrode on the semiconductor layer, the gate electrode being insulated from the source electrode and the drain electrode and having a recess part received into the receiving groove,
    wherein the mesa protrusion has a superlattice structure including a plurality of trenches at an interface between the mesa protrusion and the source electrode and between the mesa protrusion and the drain electrode, respectively, and
    the source leg and the drain leg are received in the trench.

12. The method of claim 11, wherein a lowest layer of the superlattice structure is disposed so as to be on the same level as or be above a bottom surface of the trenches.

13. The method of claim 11, wherein the superlattice structure includes a high-concentration doping layer.

14. The method of claim 13, wherein the superlattice structure includes a multi-layered 2-dimensional electron gas layer aligned in a thickness direction.

15. The method of claim 13, wherein the superlattice structure includes a multi-layered delta doping layer aligned in a thickness direction.

16. The method of claim 15, wherein the delta doping layer is formed by being doped with at least any one selected from Si, Ge, and Sn.

17. The method of claim 11, further comprising forming an oxide layer to be recessed into the receiving groove prior to the forming of the gate electrode.

18. The method of claim 17, wherein the oxide layer has a recess structure corresponding to a shape of the recess part.

19. The method of claim 17, wherein a lowest layer of the superlattice structure is disposed so as to be on the same level as or be above a bottom surface of the oxide layer.

20. The method of claim 11, further comprising forming a buffer layer on the base substrate prior to the forming of the semiconductor layer.

\* \* \* \* \*